(12) United States Patent
Toda

(10) Patent No.: US 6,800,987 B2
(45) Date of Patent: Oct. 5, 2004

(54) PROTECTIVE HOUSING FOR ULTRASONIC TRANSDUCER APPARATUS

(75) Inventor: Minoru Toda, Lawrenceville, NJ (US)

(73) Assignee: Measurement Specialties, Inc.

( * ) Notice: Subject to any disclaimer, the term of this patent is extended or adjusted under 35 U.S.C. 154(b) by 0 days.

(21) Appl. No.: 10/349,483

(22) Filed: Jan. 22, 2003

(65) Prior Publication Data

US 2004/0000838 A1 Jan. 1, 2004

Related U.S. Application Data

(60) Provisional application No. 60/350,851, filed on Jan. 22, 2002.

(51) Int. Cl.[7] .............................................. H01L 41/053
(52) U.S. Cl. ........................ 310/348; 310/334; 310/369
(58) Field of Search ................................ 310/311, 334, 310/348, 369

(56) References Cited

U.S. PATENT DOCUMENTS

| | | | | |
|---|---|---|---|---|
| 3,978,353 A | * | 8/1976 | Kinoshita | ................... 310/317 |
| 4,604,542 A | * | 8/1986 | Thompson | ................... 310/334 |
| 4,823,041 A | * | 4/1989 | Inoue et al. | ................ 310/322 |
| 4,850,450 A | * | 7/1989 | Hoyle et al. | ................ 181/102 |
| 5,097,172 A | * | 3/1992 | Becka | ........................ 310/348 |
| 5,306,980 A | * | 4/1994 | Montgomery | ............... 310/333 |
| 6,265,810 B1 | * | 7/2001 | Ngo | ........................... 310/328 |
| 6,268,683 B1 | * | 7/2001 | Li | .............................. 310/348 |
| 6,274,967 B1 | * | 8/2001 | Zumstrull et al. | .......... 310/328 |
| 6,494,288 B1 | * | 12/2002 | Tashiro et al. | ............. 181/102 |

FOREIGN PATENT DOCUMENTS

| | | | | |
|---|---|---|---|---|
| JP | 2-83987 | * | 3/1990 | ................. 310/311 |
| JP | 2-288380 | * | 11/1990 | ........... H01L/41/09 |

* cited by examiner

Primary Examiner—Thomas M. Dougherty
(74) Attorney, Agent, or Firm—Plevy & Howard, PC

(57) ABSTRACT

A protective cover or grid for an ultrasound transducer comprises a series of vertically spaced members separated from one another by a pre-determined distance, each member being of substantially uniform width and arranged in a cylindrical shape. The protection grid includes a cavity for receiving a cylindrical transducer. The protection grid operates as both a physical protection mechanism for protecting the cylindrical transducer housed therein as well as operating as an impedance matching device.

18 Claims, 12 Drawing Sheets

| | A (INCH) | B (INCH) | C (INCH) | C/(B+C) X100 (%) | D (INCH) | MAX (mVpp) | MIN (mVpp) | MIN/MAX x 100 (%) |
|---|---|---|---|---|---|---|---|---|
| 1 | 0.04 | 0.055 | 0.075 | 58 | 0.02 | 19.6 | 14.2 | 72 |
| 2 | 0.04 | 0.055 | 0.075 | 58 | 0.01 | 19.8 | 14.8 | 75 |
| 3 | 0.04 | 0.080 | 0.050 | 38 | 0.02 | 26.0 | 16.4 | 62 |
| 4 | 0.04 | 0.080 | 0.050 | 38 | 0.01 | 26.0 | 15.8 | 61 |
| 5 | 0.04 | 0.100 | 0.030 | 23 | 0.02 | 37.0 | 6.6 | 18 |
| 6 | 0.04 | 0.100 | 0.030 | 23 | 0.01 | 33.2 | 13.2 | 28 |
| 7 | 0.04 | 0.110 | 0.020 | 15 | 0.02 | 25.8 | 1.5 | 5.5 |
| 8 | 0.04 | 0.110 | 0.020 | 15 | 0.01 | 29.6 | 13.2 | 31 |
| 9 | 0.06 | 0.055 | 0.075 | 58 | 0.02 | 21.0 | 13.6 | 65 |
| 10 | 0.06 | 0.055 | 0.075 | 58 | 0.01 | 21.8 | 14.4 | 66 |
| 11 | 0.06 | 0.080 | 0.050 | 38 | 0.02 | 28.0 | 9.4 | 34 |
| 12 | 0.06 | 0.080 | 0.050 | 38 | 0.01 | 27.8 | 15.6 | 56 |
| 13 | 0.06 | 0.100 | 0.030 | 23 | 0.02 | 29.2 | 1.0 | 3.4 |
| 14 | 0.06 | 0.100 | 0.030 | 23 | 0.01 | 32.4 | 13.0 | 40 |
| 15 | 0.06 | 0.11 | 0.020 | 15 | 0.02 | 26.0 | 1.0 | 3.8 |
| 16 | 0.06 | 0.11 | 0.02 | 15 | 0.01 | 24.4 | 12.6 | 52 |

*FIG. 12*

|   | A (INCH) | B (INCH) | C (INCH) | C/(B+C) X100 (%) | D (INCH) | MAX (mVpp) | MIN (mVpp) | MIN/MAX x 100 (%) |
|---|---|---|---|---|---|---|---|---|
| 1 | 0.04 | 0.055 | 0.075 | 58 | 0.02 | 7.6 | 5.9 | 78 |
| 2 | 0.04 | 0.055 | 0.075 | 58 | 0.01 | 7.2 | 5.8 | 81 |
| 3 | 0.04 | 0.080 | 0.050 | 38 | 0.02 | 8.4 | 5.8 | 69 |
| 4 | 0.04 | 0.080 | 0.050 | 38 | 0.01 | 7.4 | 11.4 | 65 |
| 5 | 0.04 | 0.100 | 0.030 | 23 | 0.02 | 10.6 | 4.8 | 45 |
| 6 | 0.04 | 0.100 | 0.030 | 23 | 0.01 | 12.9 | 7.9 | 61 |
| 7 | 0.04 | 0.110 | 0.020 | 15 | 0.02 | 10.5 | 3.3 | 31 |
| 8 | 0.04 | 0.110 | 0.020 | 15 | 0.01 | 12.6 | 6.4 | 51 |
| 9 | 0.06 | 0.055 | 0.075 | 58 | 0.02 | 8.7 | 6.0 | 69 |
| 10 | 0.06 | 0.055 | 0.075 | 58 | 0.01 | 9.3 | 6.7 | 72 |
| 11 | 0.06 | 0.080 | 0.050 | 38 | 0.02 | 10.2 | 5.3 | 52 |
| 12 | 0.06 | 0.080 | 0.050 | 38 | 0.01 | 11.0 | 7.8 | 71 |
| 13 | 0.06 | 0.100 | 0.030 | 23 | 0.02 | 10.8 | 3.7 | 35 |
| 14 | 0.06 | 0.100 | 0.030 | 23 | 0.01 | 13.5 | 7.6 | 56 |
| 15 | 0.06 | 0.110 | 0.02 | 15 | 0.02 | 10.0 | 3.0 | 33 |
| 16 | 0.06 | 0.110 | 0.02 | 15 | 0.01 | 9.2 | 6.5 | 70 |

*FIG. 13*

PROTECTIVE HOUSING FOR ULTRASONIC TRANSDUCER APPARATUS

CLAIM FOR PRIORITY

This application claims the priority of Provisional Application 60/350,851, entitled "PROTECTIVE HOUSING FOR ULTRASONIC TRANSDUCER APPARATUS" filed Jan. 22, 2002, the contents of which are incorporated herein by reference in their entirety.

FIELD OF THE INVENTION

The present invention relates generally to ultrasonic transducers, and more particularly to protective housings for such transducers.

BACKGROUND OF THE INVENTION

Ultrasonic transducers operate to radiate ultrasonic waves through a medium such as air. In the environment of transducers, it is known that an ultrasonic transducer may be formed with either a linear or curved film incorporated therein.

Ultrasonic transducers are employed in various sensing devices such as distance meters, motion detectors or pen input devices. For example, an ultrasonic transducer mounted onto a movable pen or stylus radiates or receives ultrasonic signals through a medium (e.g. air) to a receiver system operative to calculate the position of the stylus. Letters or patterns formed from the movement of the stylus may be generated and stored in memory via a processor in a computer for display or for use in creating documents, files or graphics.

For many applications, it is desirable to provide a protective cover or housing for the transducer to minimize damage to the device through inadvertent contact, use, environmental conditions and the like. A problem with using conventional protective covers in front of a transducer, however, resides in their adverse impact on the transducer's signal transmission output and/or sensitivity to received signals. A further problem is manifest in the prevailing view that protective covers or grids should have large openings to minimize such adverse impact on signal transmission characteristics. This results in structures that are far less rugged and more susceptible to damage due to inadvertent contact with a foreign object than desired.

SUMMARY OF THE INVENTION

A protective cover or grid for an ultrasound transducer comprises a series of vertically spaced members separated from one another by a pre-determined distance, each member being of substantially uniform width and arranged in a cylindrical shape. The protection grid includes a cavity for receiving a cylindrical transducer. The protection grid operates as both a physical protection mechanism for protecting the cylindrical transducer housed therein as well as operating as an impedance matching device.

In an alternative embodiment, a protection grid for housing an ultrasound transducer comprises a cylindrical tubing concentrically arranged with the transducer and having an opening at a first end for receiving the ultrasound transducer, the cylindrical tubing comprising a plurality of holes formed on the cylindrical surface thereof so as to provide a passageway for ultrasonic radiation. In a particular embodiment, the wall thickness may be about 1 millimeter and the inner diameter of the wall about 12.9 millimeters with the space between the transducer film surface and the inner surface of the wall being about 1.1 millimeters.

In combination with an omnidirectional ultrasound transducer comprising a cylindrical piezoresponsive material operative for transmitting and/or receiving ultrasound signals in a direction normal to the piezoresponsive material at a predetermined resonance frequency, a housing surrounding the ultrasound transducer for providing environmental protection and enhancing signal transmission. The housing comprises a base portion having an opening for receiving the ultrasound transducer and a cylindrical portion extending from the base portion for surrounding the ultrasound transducer cylindrical piezoresponsive material. The cylindrical portion comprises a plurality of slots disposed about the cylindrical portion for passing ultrasound radiation. The plurality of slots are arranged in a predetermined fashion and spaced apart from one another such that the total area of the plurality of slots is about 55% of the area of the cylindrical portion, whereby the cylindrical portion operates as an impedance matching layer with the ultrasound radiation for increasing the sensitivity or output transmission of the transducer.

BRIEF DESCRIPTION OF THE DRAWINGS

FIGS. 12–13 illustrate exemplary test results at different cycle bursts for a transducer housing formed in accordance with the principles of the present invention.

DETAILED DESCRIPTION OF THE INVENTION

In accordance with the principle that reflections between terminal impedance and an obstacle enable conversion of the line impedance to match that of the terminal impedance, an aspect of the present invention is the application of this principle to provide a protective housing in front of a transducer that protects the transducer from physical damage while increasing the transmission output or sensitivity as a result of impedance matching with the signal transmission.

Figure 1A:
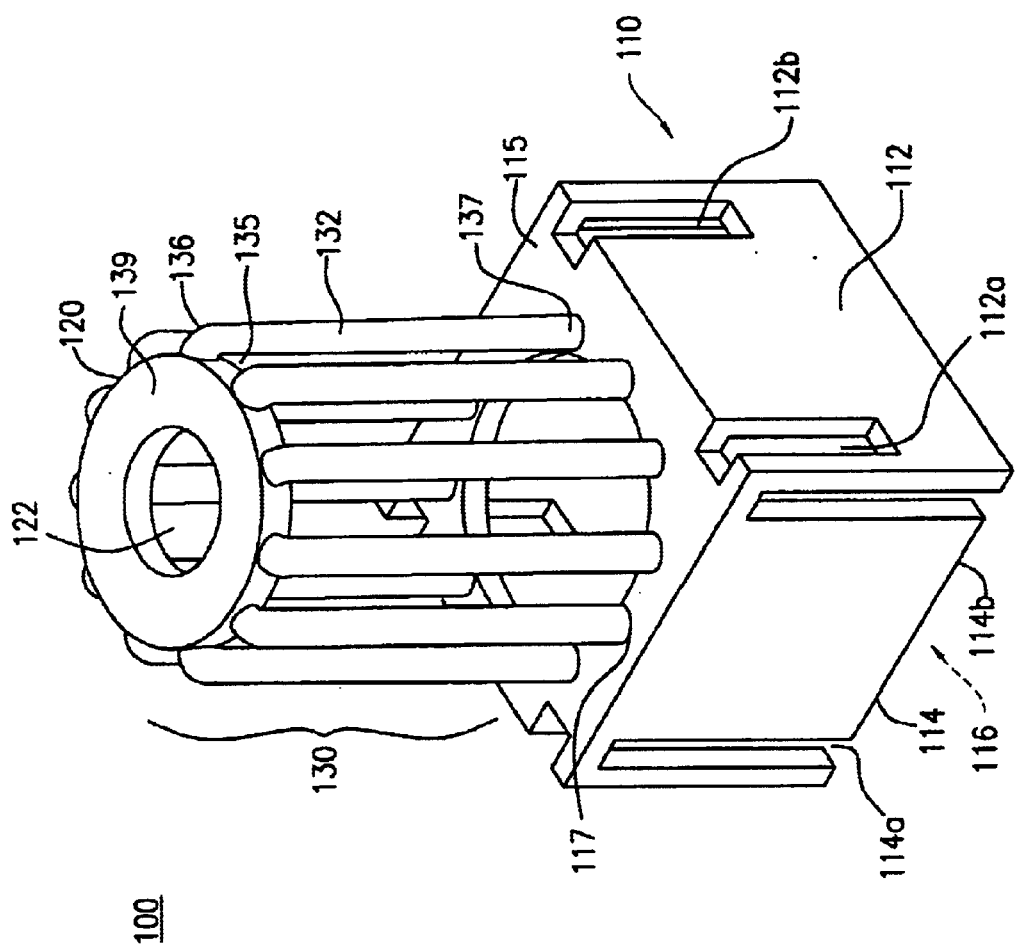
FIG. 1A is an exemplary embodiment of a protective housing for an ultrasound transducer in accordance with an aspect of the present invention.
Figure 3:
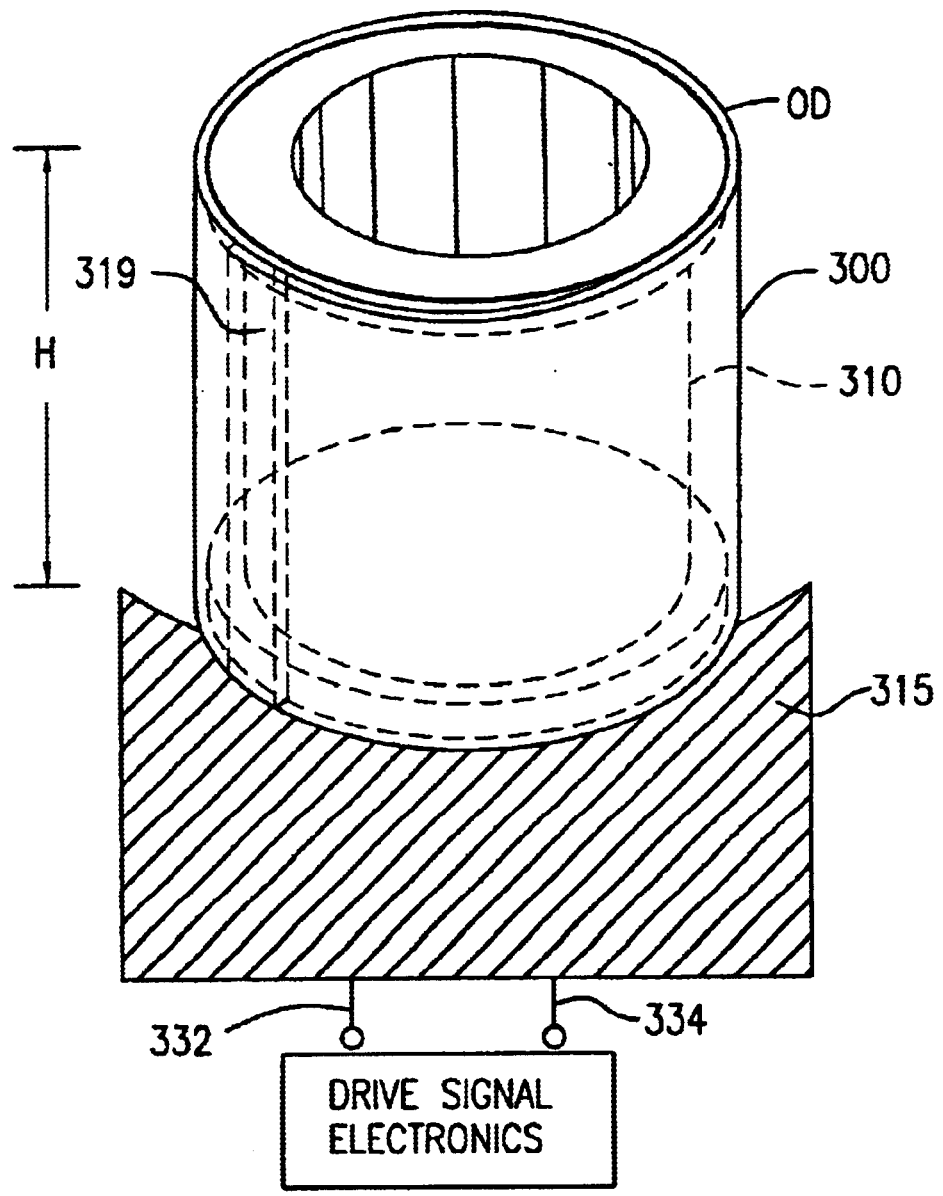
FIG. 3 is an exemplary illustration of an omni-directional ultrasound transducer insertable into a protective housing in accordance with an aspect of the present invention.

Referring now to FIG. 1A, there is shown an exemplary illustration of a protective cover 100 for housing an ultrasound transducer such as a PVDF film cylindrical transducer shown in FIG. 3, the protective cover having an impedance matching function for the ultrasound transducer so as to increase sensitivity or signal transmission associated with the device. Protective cover 100 comprises a base portion 110 having an opening 116 for receiving the ultrasound transducer, and a cylindrical portion 130 extending from the base portion and surrounding the ultrasound transducer. In the embodiment shown in FIG. 1A, the cylindrical portion 130 comprises a plurality of elongate members 132 extending vertically from the base portion and uniformly disposed about the base portion in cylindrical fashion. Each elongate member is coupled at a distal end 137 to a top surface 115 of base portion 110 and a proximal end 139 to disc-shaped top portion 120. The proximal end of elongate member 132 comprises arcuate portion 136 for coupling to a side surface of top portion 120. Each of the elongate members 132 are separated from a corresponding adjacent elongate member by a substantially uniform slot 135. An important principle recognized by the inventors and applied herein is the use of a protective cover having a series of small slots or openings 135 which increase the ultrasonic transmission/sensitivity as a result of impedance matching of the slotted cover with the ultrasonic wave transmission. Problems associated with covers that were not sufficiently durable or did not adequately protect the ultrasound transducer due to wide openings within the cover (as large openings were thought to minimize the suppression of wave transmission) are overcome by embodiments of the present invention.

Still referring to the exemplary embodiment of FIG. 1A, top surface 115 of base portion 110 includes circular aperture 117 sized to accommodate insertion of a cylindrical transducer (see FIG. 3) therethrough. The vertical, elongated members 132 are disposed on the top surface about the perimeter of aperture 117. Base portion 110 further includes pairs 112, 114 of planar side walls extending vertically downward from top surface 115. Slots 112a, 112b are formed on portions of each side wall pair 112 and extend to portions of top surface 115 for receiving and securing corresponding tabs (not shown) formed on base or holder 315 (see FIG. 3) of the ultrasound transducer. In an exemplary embodiment, the transducer is inserted through opening 116, with the cylindrical film proceeding through aperture 117 and snap fit with the protective cover via engagement of the transducer holder 135 tabs with corresponding slots 112a, 112b. In this manner, the transducer base or holder 135 is received into and secured via the corresponding base portion of cover 100, while the cylinder film transducer element is received into and surrounded or protected via slotted cylinder portion 130. The protective cover 100 is preferably monolithically formed of a lightweight, flexible yet resilient, durable material such as a plastic. Slots 114a, 114b formed on portions of side wall pair 114 facilitate the sides of the base portion to flex as necessary to accommodate insertion or removal of the transducer structure from the cover.

Figure 1B:
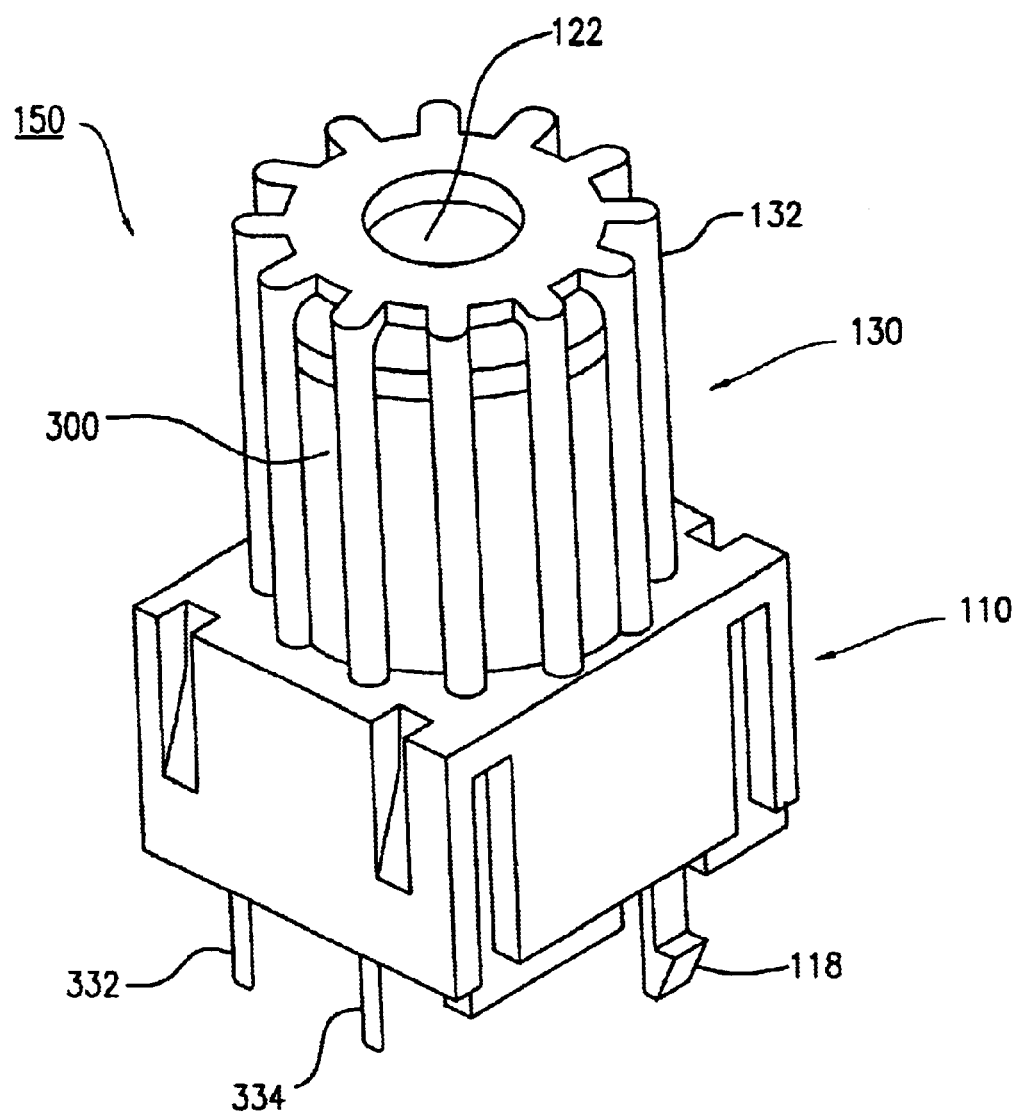
FIG. 1B is another exemplary embodiment of a protective housing for an ultrasound transducer in accordance with another aspect of the present invention.

FIG. 1B is an exemplary illustration of a transducer assembly 150 with protective housing in accordance with an aspect of the present invention. Transducer assembly 150 with protective housing comprises piezoelectric cylindrical film transducer 300 protectively surrounded by slotted cylindrical housing portion 130 and spaced apart therefrom a predetermined distance for providing omni-directional horizontal beam directivity and broad band characteristics operable at a frequency of 40 KHz. Transducer base or holder 315 (see FIG. 3) coupled to and supporting transducer 300 is enclosed and protected within housing base portion 110 and secured thereto as described above. Electrical connection or leads 332, 334 extend out from the assembly and provide electrical communication between the transducer and drive electronics/preamplifier board for transmitter/receiver operation. The leads may be inserted into a PCB board or test board for snap in mounting with the aid of securing member 118.

Figure 2:
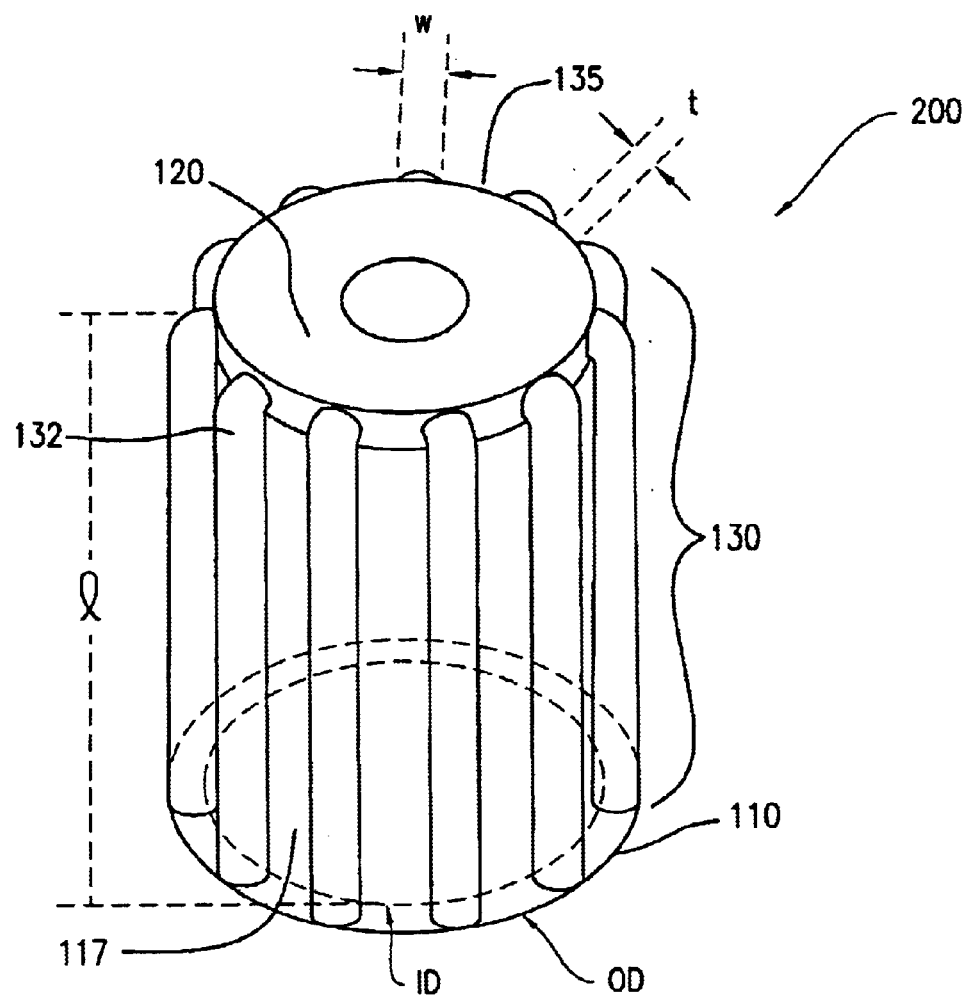
FIG. 2 is another exemplary embodiment of a protective housing for an ultrasound transducer in accordance with another aspect of the present invention.

FIG. 2 is a variation to the embodiment illustrated in FIG. 1A wherein a protective cover 200 containing the cylindrical portion 130 with the base portion 110' comprising an annular ring terminating at aperture 117. Protective cover 200 provides environmental protection for a cylindrical transducer, as well impedance matching for a transducer resonating at about 37 kHz, for example. As shown therein, the width w of each elongated member 132 in the angle direction as an obstacle to wave transmission is about 1.5 mm (about 0.17λ). The dimension in the propagation direction is about 1 mm (about 0.116λ). As previously described, the protective cover, including each of the elongate members, may be made of a lightweight, durable material such as a plastic. Each of the elongate members are vertically arranged on the cylindrical dimension and have an inner diameter (ID) of about 12.9 mm and an outer diameter (OD) of about 14.9 mm. The vertical length l associated with the length of each of the elongate members 132 is about 14.5 mm. The openings or slots 135 at the inner diameter between adjacent elongated members have a width t of about 1.8 mm (0.218λ). The total slot widths comprise about 55% of the total area of the outer cylindrical portion (i.e. w=1.5 mm+t= 1.88 mm).

In the exemplary embodiment shown in FIG. 3, an ultrasound transducer insertable into the protective cover comprises a piezoelectric film 300 of height H wrapped in cylindrical fashion around a cylindrical frame member 310. That is, the film may be supported by a cylindrical frame member cylindrical body or spool body as disclosed in commonly assigned U.S. Pat. No. 6,239,535 entitled Omnidirectional Ultrasonic Transducer Apparatus having Controlled Frequency Response and incorporated herein by reference in its entirety. The cylindrical piezoelectric film may have its stretched axis wrapped around in cylindrical fashion such that when an AC voltage is applied to electrodes on surfaces of the cylindrical film, the length vibration is converted to radial vibration. Piezoelectric film such as PVDF may be used. The piezoelectric film 300 may have disposed thereon an electrode region covering the film except for the peripheral edge portions of the film and a non-electrode separation region. The cylindrical transducer operates as a transmitter to provide an omnidirectional beam signal propagating in a direction normal to the surface of the piezoelectric material. It is understood that the film must be secured in some fashion to itself when wrapped into a cylinder. As an example, one end (lateral end) of the film is joined to the opposite end by overlapping 319 the opposite ends and securing the same together. In this instance, securing of the lateral edges together may be made via an adhesive, ultrasonic welding or other processes for securing the piezoelectric film edges together (e.g. thermally deformable nails). Electrical connection may be made to corresponding portions of the cylindrical transducer via leads 332, 334 to generate a drive signal or receive an acoustic signal emanating from the transducer for appropriate signal processing. A transducer holder 315 may be disposed beneath cylindrical transducer 300 and coupled thereto for supporting the transducer and facilitating insertion of the transducer into the protective housing. In the exemplary embodiment shown herein, the outer diameter (OD) of the PVDF film is about 10.7 mm and it's height H is about 12.5 mm. Separation distance from the inner diameter of the elongate members 132 to the PVDF surface is about 1.1 mm (0.128λ).

Figure 4:
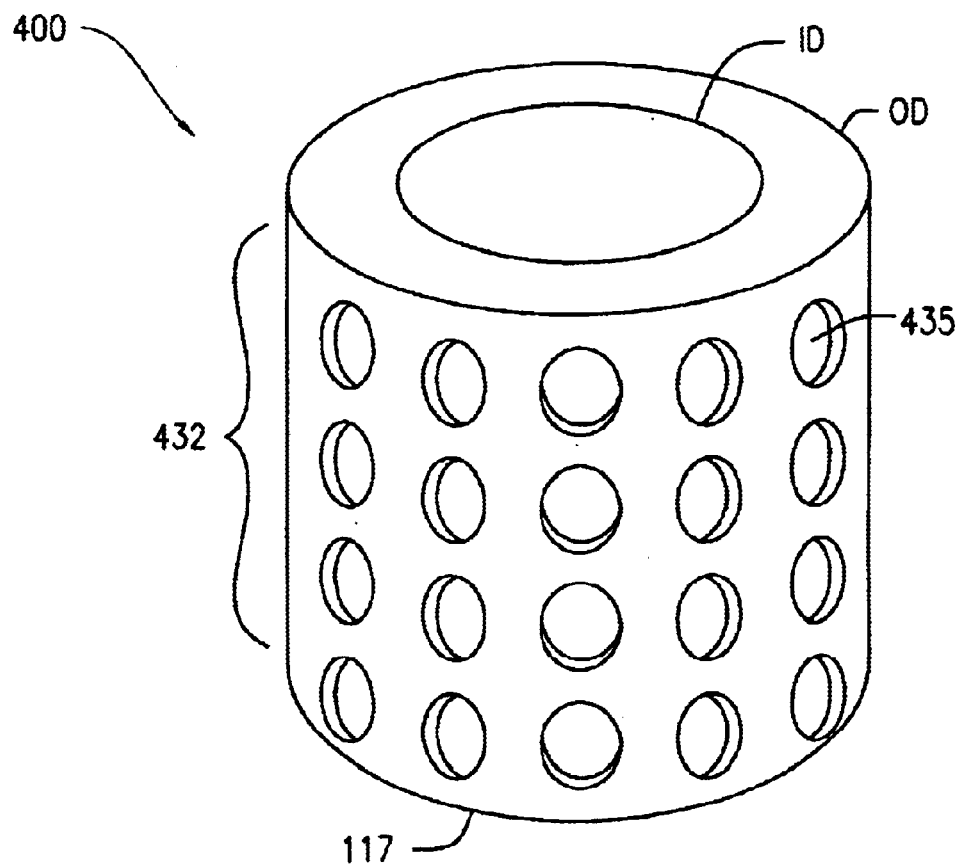
FIG. 4 is an alternative embodiment of the protective housing structure for an ultrasound transducer having an impedance matching in accordance with an aspect of the present invention.

FIG. 4 illustrates an alternative embodiment of the protective housing structure for an ultrasound transducer having an impedance matching in accordance with an aspect of the present invention. As shown in FIG. 4, the shape of the protective housing need not include a series of vertically oriented elongate bars. Rather, as shown in FIG. 4, the housing 400 comprises cylindrical portion 432, having an opening 117 for receiving the ultrasound transducer such that the cylindrical portion 432 is concentrically arranged and surrounds the cylindrical transducer element. Small slots or through holes 435 are formed on the wall surface of the cylindrical portion 432 such that the passage rate of transmitted ultrasound radiation is about 55%. In a preferred embodiment, the slots or holes are of uniform size and uniformly disposed about the surface of the cylinder. The wall thickness of the housing structure 400 is about 1 mm with an inner diameter (ID) of about 12.9 mm. The space or distance between the film surface and the inner wall is about 1.1 mm for an ultrasound transducer operating at about 37 kHz.

Figure 5:
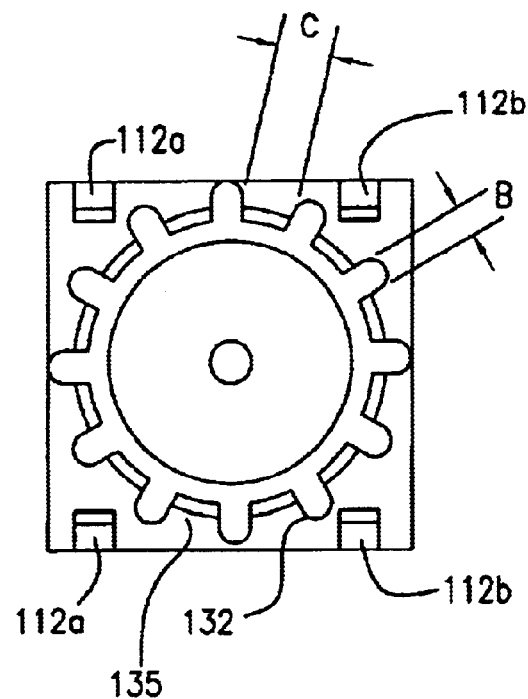
FIG. 5 is a schematic top view of the housing of FIG. 1B.
Figure 6:
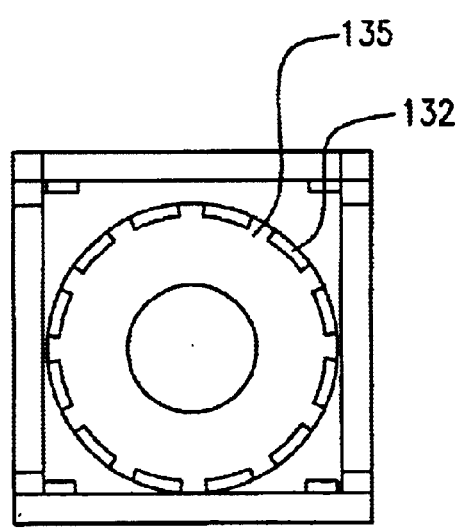
FIG. 6 is a schematic bottom view of the housing of FIG. 1B.
Figure 7:
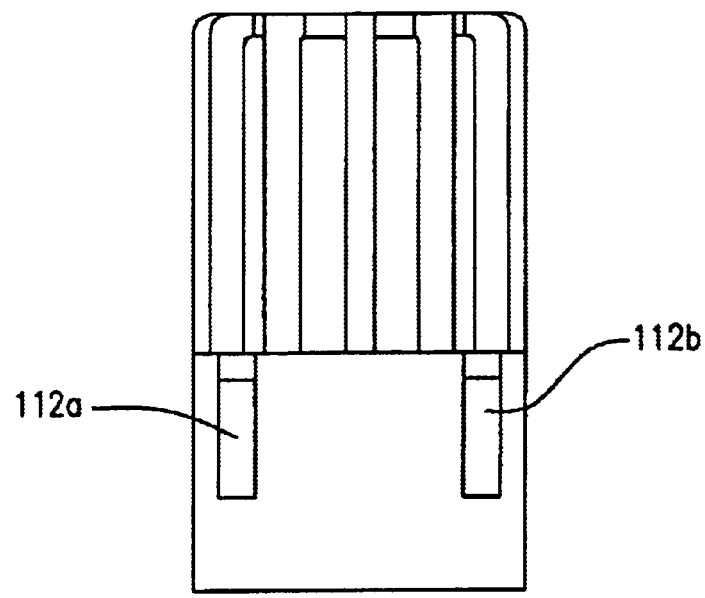
FIGS. 7–8 are schematic side views of the housing of FIG. 1B.
Figure 8:
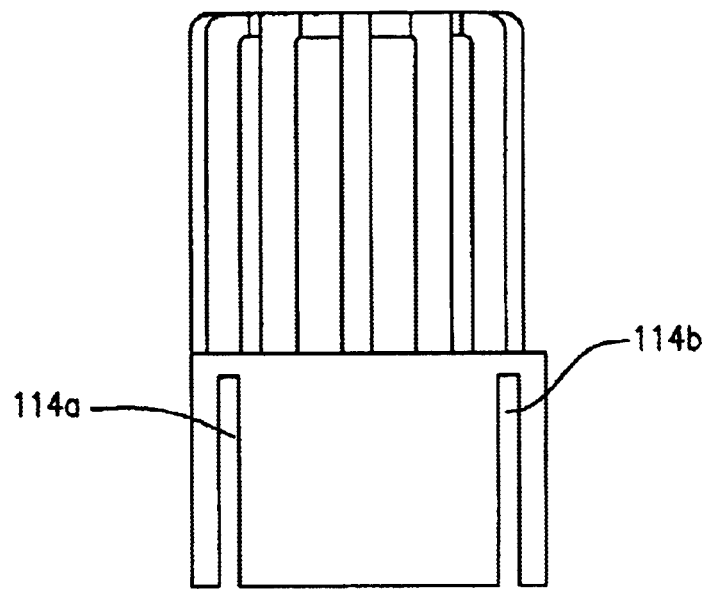
Figure 9:
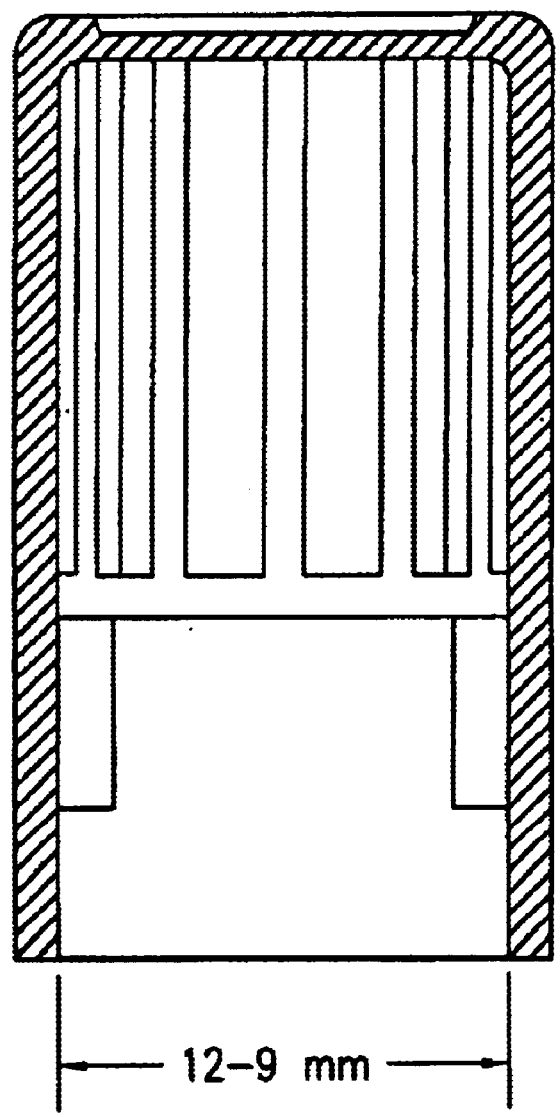
FIG. 9 is a schematic cross-section view taken along A—A of FIG. 8.

FIGS. 5–9 provide schematic illustrations of a protective housing structure in accordance with the design shown in FIG. 1B. As shown, FIG. 5 represents a top view of the protective housing, while FIG. 6 provides a bottom view of the housing design. Unless otherwise specified, all dimensions are shown in millimeters (mm). FIGS. 7 and 8 show various side views of the transducer cover while FIG. 9 represents a cross-sectional view of FIG. 8.

Figure 10:
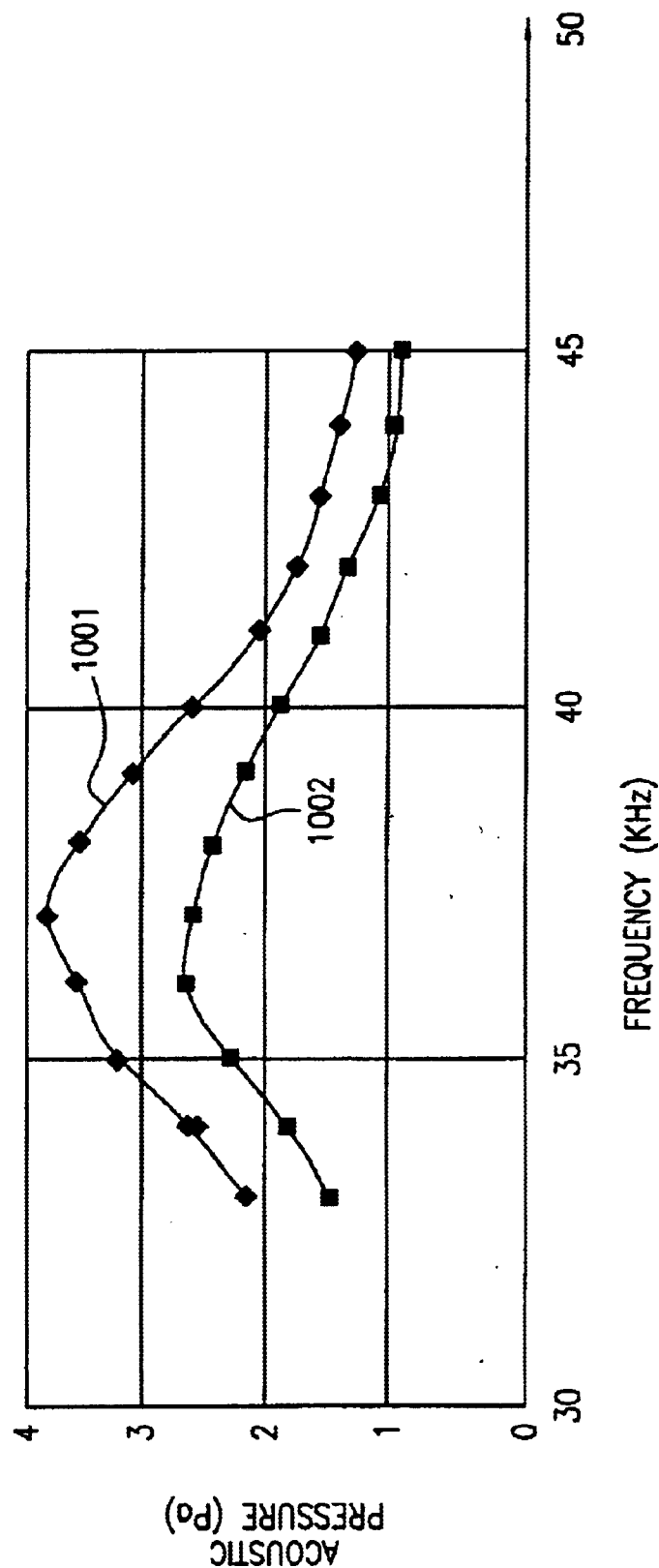
FIG. 10 represents an exemplary graphical illustration of acoustic pressure outputs for a PVDF cylindrical transducer operative as a transmitter as a function of frequency.
Figure 11:
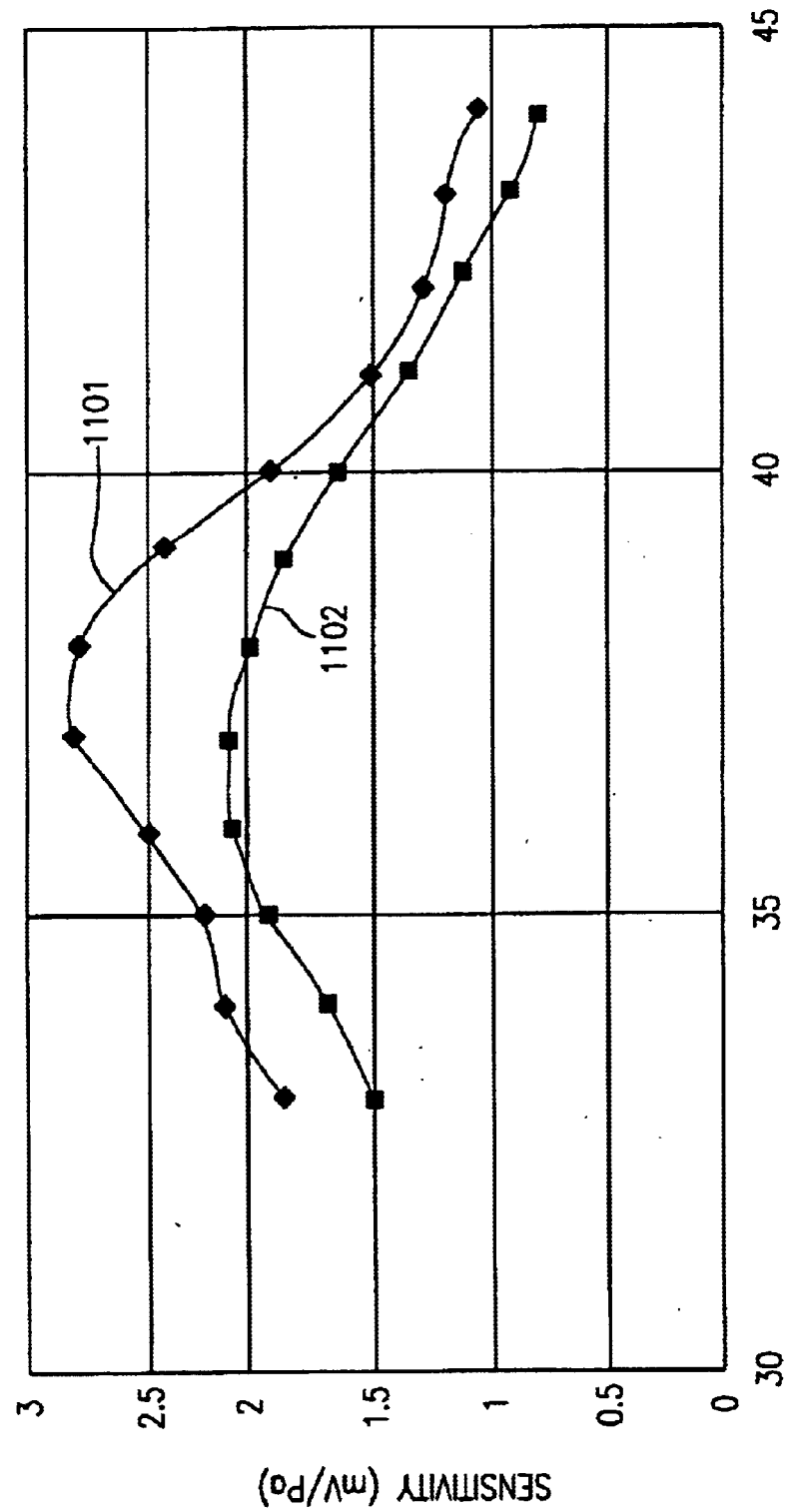
FIG. 11 is a graphical representation of ultrasound receiver sensitivity as a function of frequency for a cylindrical PVDF transducer with and without a protective housing embodied in the present invention.

FIG. 10 represents an exemplary graphical illustration of acoustic pressure outputs for a PVDF cylindrical transducer operative as a transmitter at 30 cm as a function of frequency. Curve 1001 represents the output of the transducer with the protective cover described with respect to FIG. 2, while lower curve 1002 represents the transducer output without a protective cover. As one can see, the protective cover or grid enhances the acoustic pressure by about 40%. FIG. 11 is a graphical representation of ultrasound receiver sensitivity as a function of frequency for a cylindrical PVDF transducer with (curve 1101) and without (curve 1102) the protective cover. As can be seen, sensitivity is enhanced by about 32% with the inventive cover. When the protection grid is used for a transmitter and receiver the total effect is about 85% higher than the case of no protective cover.

Note that as the resonance frequency changes, the wavelength also changes so that the dimension of the protective cover is also varied in proportion to the wavelength. For example, for a transducer resonating at about 74 kHz, the above dimensions should be about halved. That is, for optimal performance, the elongate members should have a width of about 0.75 mm in angular direction, and a width of about 0.5 mm in the propagation direction. Preferably, twelve elongate members are arranged in the cylindrical dimension with an inner diameter of about 6.4 mm and an outer diameter of about 7.45 mm. The opening at the inner diameter is 0.94 mm for each. The diameter for the PVDF film is about 5.35 mm and at a height of about 6.25 mm. The separation between the inner diameter of the plastic elongate member to the PVDF film surface is about 0.55 mm.

FIGS. 12 and 13 illustrate exemplary test results at different cycle bursts for a transducer housing formed in accordance with the principles of the present invention and used to provide protection and impedance matching of a 40 KHz cylindrical ultrasound transducer for comparison with the output of the same transducer without the protective housing. Dimensions A (distance vertical member 132 extends horizontally outward), B (width of vertical member 132), C (width of slot 135) (see FIG. 5) and D (distance between cylindrical piezoelectric film and cylindrical housing) are illustrated in FIG. 12 in tabular format for a 15 cycle burst at 40 KHz. Uniformity is given as (Min/Max) *100% while the passage rate for the protective slotted housing is given by C/(B+C)*100%. Signal parameters for the transducer without the protective slotted housing were found to be Max: 14.3 mVpp, Min: 10.2 mVpp, uniformity: 71%. FIG. 13 illustrates the same dimensional variations as shown in FIG. 12, but for a 1 cycle burst. In this case, signal parameters for the transducer without the protective slotted housing were found to be Max: 5.2 mVpp, Min: 4.2 mVpp, uniformity: 80.7%.

As disclosed herein, a suitably designed obstacle at the front of the transducer plays a role of both protecting the transducer and impedance matching of the signal to provide an increase in the output of the ultrasonic wave (or increase in receiver sensitivity) thus also increasing the bandwidth of the device. It is to be understood that the embodiments and variations shown and described herein are for illustrations only and that various modifications may be implemented by those skilled in the art without departing from the scope of the invention.

What is claimed is:

1. A housing for an ultrasound transducer comprising:
   a base portion having an opening for receiving the ultrasound transducer; and a cylindrical portion extending from said base portion for surrounding the ultrasound transducer; said cylindrical portion comprising a plurality of slots disposed about said cylindrical portion for passing ultrasound radiation, said plurality of slots arranged in a predetermined fashion and spaced apart from one another such that the total area of said plurality of slots is about 55% of the area of said cylindrical portion, whereby said cylindrical portion operates as an impedance matching layer with the ultrasound radiation for increasing the sensitivity or output transmission of the transducer.

2. The housing according to claim 1, wherein the cylindrical portion comprises a plurality of elongate members extending vertically from the base portion and uniformly disposed about the base portion in cylindrical fashion, each said elongate member separated from one another by a corresponding one of said plurality of slots.

3. The housing according to claim 2, further comprising a top portion opposite said base portion and coupled to ends of said plurality of elongate members.

4. The housing according to claim 3, wherein said top portion comprises a disc shaped member having an aperture formed therein and a circumferentially extending side surface to which said plurality of elongate members are coupled.

5. The housing according to claim 2, wherein the width of each elongated member is about 1.5 mm.

6. The housing according to claim 2, wherein the housing comprises a flexible plastic material.

7. The housing according to claim 1, wherein the slots comprise holes formed on a wall surface defining said cylindrical portion.

8. The housing according to claim 7, wherein the holes are of uniform size and uniformly disposed about the wall surface.

9. The housing according to claim 8, wherein the thickness of the wall surface is about 1 mm and wherein an inner diameter of the cylindrical portion is about 12.9 mm.

10. A housing for an ultrasound transducer comprising:
a plurality of elongate members disposed in cylindrical fashion and interconnected to form a cylinder having an opening for receiving said ultrasound transducer, each elongate member separated from an adjacent one of said elongate members so as to define a slot therebetween, said plurality of slots arranged in predetermined fashion and spaced apart from one another such that said plurality of elongate members operate as an impedance matching layer for the ultrasound radiation for increasing the sensitivity or output transmission of the transducer.

11. The housing according to claim 10, wherein said plurality of slots are of uniform width.

12. The housing according to claim 10, wherein the housing is monolithic and comprises a flexible plastic material.

13. The housing of claim 10, wherein said plurality of elongate members comprises at least 12 said members.

14. In combination with an omnidirectional ultrasound transducer comprising a cylindrical piezoresponsive material operative for transmitting and/or receiving ultrasound signals in a direction normal to the piezoresponsive material at a predetermined resonance frequency, a housing surrounding said ultrasound transducer for providing environmental protection and enhancing signal transmission, said housing comprising a base portion having an opening for receiving the ultrasound transducer; and a cylindrical portion extending from said base portion for surrounding the ultrasound transducer cylindrical piezoresponsive material; said cylindrical portion comprising a plurality of slots disposed about said cylindrical portion for passing ultrasound radiation, said plurality of slots arranged in a predetermined fashion and spaced apart from one another such that the total area of said plurality of slots is about 55% of the area of said cylindrical portion, whereby said cylindrical portion operates as an impedance matching layer with the ultrasound radiation for increasing the sensitivity or output transmission of the transducer.

15. The combination according to claim 14, wherein said transducer includes a base portion supporting said cylindrically shaped piezoresponsive material, said transducer base portion engageable with said housing base portion for releasably securing said transducer within said housing.

16. The combination according to claim 14, wherein said housing is monolithic and comprises a flexible plastic material.

17. The combination according to claim 15, wherein said cylindrical portion comprises a plurality of elongate members extending vertically from the base portion and uniformly disposed about the base portion in cylindrical fashion, each said elongate member separated from one another by a corresponding one of said plurality of slots.

18. The combination according to claim 17, said housing base portion further comprising a securing member for snap in mounting of said transducer to a printed circuit board.

* * * * *